(12) United States Patent
Shimizu

(10) Patent No.: US 8,362,830 B2
(45) Date of Patent: Jan. 29, 2013

(54) POWER SEMICONDUCTOR DEVICE

(75) Inventor: Kazuhiro Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 158 days.

(21) Appl. No.: 13/018,823

(22) Filed: Feb. 1, 2011

(65) Prior Publication Data

US 2011/0316115 A1 Dec. 29, 2011

(30) Foreign Application Priority Data

Jun. 25, 2010 (JP) ................................ 2010-145346

(51) Int. Cl.
*H03K 19/0948* (2006.01)
*H01L 21/8238* (2006.01)
*H01L 25/16* (2006.01)

(52) U.S. Cl. .......... 327/566; 326/81; 257/369; 257/370; 257/E27.046

(58) Field of Classification Search ................... 257/369, 257/370; 327/564–566; 326/81, 83, 84, 326/92

See application file for complete search history.

(56) References Cited

U.S. PATENT DOCUMENTS

| | | | | |
|---|---|---|---|---|
| 5,373,435 A | * | 12/1994 | Jayaraman et al. | ............ 363/98 |
| 5,502,632 A | * | 3/1996 | Warmerdam et al. | ........... 363/98 |
| 5,666,280 A | * | 9/1997 | Janaswamy et al. | ............ 363/98 |

(Continued)

FOREIGN PATENT DOCUMENTS

| | | |
|---|---|---|
| DE | 103 22 742 B4 | 3/2008 |
| JP | 2002-324848 | 11/2002 |

(Continued)

OTHER PUBLICATIONS

Kiyoto Watabe et al., "A Half-Bridge Driver IC with Newly Designed High Voltage Diode", Proceedings of 2001 International Symposium on Power Semiconductor Devices & ICs, 2001, pp. 279-283.

(Continued)

*Primary Examiner* — Evan Pert
(74) *Attorney, Agent, or Firm* — Oblon, Spivak, McClelland, Maier & Neustadt, L.L.P.

(57) ABSTRACT

A power semiconductor device comprises: a high-voltage side switching element and a low-voltage side switching element which are totem-pole-connected in that order from a high-voltage side between a high-voltage side potential and a low-voltage side potential; a high-voltage side drive circuit that drives the high-voltage side switching element; a low-voltage side drive circuit that drives the low-voltage side switching element; a capacitor which has a first end connected to a connection point between the high-voltage side switching element and the low-voltage side switching element and a second end connected to a power supply terminal of the high-voltage side drive circuit and supplies a drive voltage to the high-voltage side drive circuit; and a diode which has an anode connected to a power supply and a cathode connected to the second end of the capacitor and supplies a current from the power supply to the second end of the capacitor, wherein the diode includes a P-type semiconductor substrate, an N-type cathode region on a surface of the P-type semiconductor substrate, a P-type anode region in the N-type cathode region, a P-type contact region and an N-type contact region in the P-type anode region, a cathode electrode connected to the N-type cathode region, and an anode electrode connected to the P-type contact region and the N-type contact region.

7 Claims, 25 Drawing Sheets

U.S. PATENT DOCUMENTS

| | | | | |
|---|---|---|---|---|
| 7,439,771 | B2 * | 10/2008 | Ludikhuize et al. | 326/68 |
| 7,688,052 | B2 * | 3/2010 | Rozsypal et al. | 323/282 |
| 7,863,877 | B2 * | 1/2011 | Briere | 323/282 |
| 8,148,964 | B2 * | 4/2012 | Briere | 323/282 |
| 2009/0002060 | A1 * | 1/2009 | Giandalia et al. | 327/534 |

FOREIGN PATENT DOCUMENTS

| | | |
|---|---|---|
| JP | 2004-47937 | 2/2004 |
| JP | 2007-181084 | 7/2007 |
| JP | 2008-227167 | 9/2008 |

OTHER PUBLICATIONS

Office Action issued Aug. 31, 2012 in German Patent Application No. 10 2011 075 367.2 with English-language translation, 11 pages.

\* cited by examiner

POWER SEMICONDUCTOR DEVICE

BACKGROUND OF THE INVENTION

1. Field of the Invention

The present invention relates to a power semiconductor device obtaining a drive voltage of a high-voltage side drive circuit by charging a capacitor using a diode, and in particular to a power semiconductor device which makes it possible to reduce power consumption.

2. Background Art

In a half-bridge circuit, a high-voltage side drive circuit that drives a high-voltage side switching element requires a higher drive voltage than a main power supply. Accordingly, it is a known practice that this drive voltage is obtained by charging a capacitor using a diode (e.g., see K. Watabe et al., "A Half-Bridge Driver IC with Newly Designed High Voltage Diode", Proc. Of ISPSD 2001, pp. 279-282).

SUMMARY OF THE INVENTION

The diode incorporated in the drive circuit includes a P-type semiconductor substrate, an N-type cathode region provided on the substrate surface and a P-type anode region provided in the N-type cathode region. The two semiconductor regions and the semiconductor substrate constitute a parasitic PNP transistor. When the capacitor is charged, a forward current flows into the diode. This forward current also becomes a base current of the parasitic PNP transistor, and therefore a collector current of the parasitic PNP transistor flows from the P-type anode region into the P-type semiconductor substrate. The collector current only flows into GND and only becomes loss without contributing to IC operation. Prior arts have a problem of having much loss, thereby resulting in large power consumption.

In view of the above-described problems, an object of the present invention is to provide a power semiconductor device which makes it possible to reduce power consumption.

According to the present invention, a power semiconductor device comprises: a high-voltage side switching element and a low-voltage side switching element which are totem-pole-connected in that order from a high-voltage side between a high-voltage side potential and a low-voltage side potential; a high-voltage side drive circuit that drives the high-voltage side switching element; a low-voltage side drive circuit that drives the low-voltage side switching element; a capacitor which has a first end connected to a connection point between the high-voltage side switching element and the low-voltage side switching element and a second end connected to a power supply terminal of the high-voltage side drive circuit and supplies a drive voltage to the high-voltage side drive circuit; and a diode which has an anode connected to a power supply and a cathode connected to the second end of the capacitor and supplies a current from the power supply to the second end of the capacitor, wherein the diode includes a P-type semiconductor substrate, an N-type cathode region on a surface of the P-type semiconductor substrate, a P-type anode region in the N-type cathode region, a P-type contact region and an N-type contact region in the P-type anode region, a cathode electrode connected to the N-type cathode region, and an anode electrode connected to the P-type contact region and the N-type contact region.

The present invention makes it possible to reduce power consumption.

Other and further objects, features and advantages of the invention will appear more fully from the following description.

DETAILED DESCRIPTION OF THE PREFERRED EMBODIMENTS

A power semiconductor device according to the embodiments of the present invention will be described with reference to the drawings. The same components will be denoted by the same symbols, and the repeated description thereof may be omitted.

First Embodiment

Figure 1:
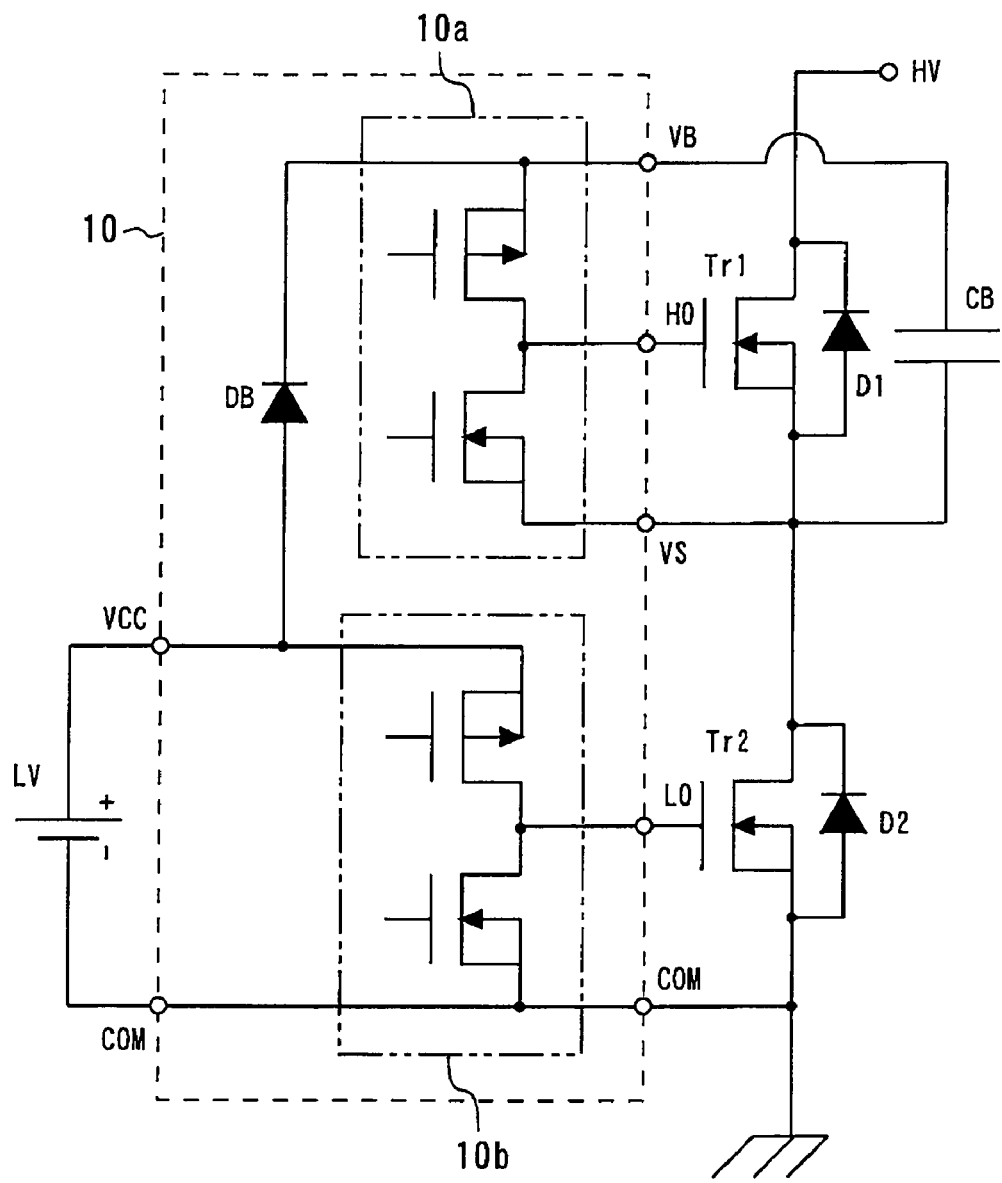
FIG. 1 is a circuit diagram of a power semiconductor device according to First embodiment.

FIG. 1 is a circuit diagram of a power semiconductor device according to First embodiment. This power semiconductor device is a half-bridge circuit that applies HVIC (High Voltage Integrated Circuit).

Between a high-voltage side potential and a low-voltage side potential of a main power supply HV, a high-voltage side switching element Tr1 and a low-voltage side switching element Tr2 are totem-pole-connected in that order from the high-voltage side. The high-voltage side switching element Tr1 and the low-voltage side switching element Tr2 are N-type semiconductor switching elements. Circulation diodes D1 and D2 are anti-parallel-connected to the high-voltage side switching element Tr1 and the low-voltage side switching element Tr2 respectively.

The drive circuit 10 includes a high-voltage side drive circuit 10a that drives the high-voltage side switching element Tr1 and a low-voltage side drive circuit 10b that drives the low-voltage side switching element Tr2. A VB terminal of the drive circuit 10 is a power supply terminal of the high-voltage side drive circuit 10a. A VCC terminal is a power supply terminal of the low-voltage side drive circuit 10b and connected to a low-voltage side drive power supply LV. A COM terminal is connected to GND (grounding point). Via an HO terminal, an ON/OFF command is outputted from the high-voltage side drive circuit 10a to the high-voltage side switching element Tr1, and via a LO terminal, an ON/OFF command is outputted from the low-voltage side drive circuit 10b to the low-voltage side switching element Tr2. A VS terminal is connected to a connection point between the high-voltage side switching element Tr1 and the low-voltage side switching element Tr2.

Here, the emitter (VS terminal) potential (VS potential) of the high-voltage side switching element Tr1 varies between a GND potential and the high-voltage side potential of the main power supply HV depending on an ON/OFF state of the low-voltage side switching element Tr2 and circulation of the current flowing into the load or the like. For this reason, the high-voltage side drive circuit 10a operates using the VS potential as a reference and has a structure potentially floating (insulated) from GND.

Furthermore, to drive the high-voltage side switching element Tr1, a higher potential needs to be applied to the gate thereof than that of the emitter. When the high-voltage side switching element Tr1 is ON, the emitter potential (VS potential) becomes substantially equal to the high-voltage side potential of the main power supply HV. Therefore, to keep the high-voltage side switching element Tr1 in an ON state, a high-voltage side potential+gate drive voltage needs to be applied to the gate. For this reason, the operation voltage of the high-voltage side drive circuit 10a needs to be set higher than the potential of the main power supply HV.

Thus, a capacitor CB and a high withstand voltage diode DB are provided. One end of the capacitor CB is connected to the VS terminal, the other end is connected to the VB terminal. The capacitor CB supplies a drive voltage to the high-voltage side drive circuit 10a via the VB terminal. The anode of the diode DB is connected to the low-voltage side drive power supply LV and the cathode is connected to the other end of the capacitor CB. The high withstand voltage diode DB supplies a current from the low-voltage side drive power supply LV to the other end of the capacitor CB and changes the capacitor CB. By adding this charge voltage to the emitter potential (VS potential) of the high-voltage side switching element Tr1, it is possible to obtain an operation voltage of the high-voltage side drive circuit 10a.

Next, the operation of the above described power semiconductor device will be described. When the high-voltage side drive circuit 10a causes the high-voltage side switching element Tr1 to turn OFF and the low-voltage side drive circuit 10b causes the low-voltage side switching element Tr2 to turn ON, the VS potential decreases close to the GND potential. In this case, the high withstand voltage diode DB is forward-biased, and therefore a charge current flows into the capacitor CB via the high withstand voltage diode DB. The voltage relationship in this case is expressed by the following equations.

$$VCC = VB + VF \quad \text{(Equation 1)}$$

$$VB = Q/CB + VS \quad \text{(Equation 2)}$$

$$VS = Von \quad \text{(Equation 3)}$$

Here, VCC denotes a potential of the VCC terminal, VB denotes a potential of the VB terminal, VF denotes a forward direction voltage [V] of the high withstand voltage diode DB, Q denotes a total amount of charge [C] charged into the capacitor CB, CB denotes a capacitance value [F] of the capacitor CB, VS denotes a potential of the VS terminal, Von denotes an ON voltage [V] of the low-voltage side switching element Tr2.

With the above described relational expression, the voltage of the capacitor CB, that is, the voltage between the VB terminal and the VS terminal is expressed as follows.

$$VB - VS = Q/CB = Vcc - VF - Von \quad \text{(Equation 4)}$$

Therefore, during charge, a charge current corresponding to the amount of charge Q is supplied to the capacitor CB via the high withstand voltage diode DB.

On the other hand, when the high-voltage side drive circuit 10a causes the high-voltage side switching element Tr1 to turn ON and the low-voltage side drive circuit 10b causes the low-side switching element Tr2 to turn OFF, the VS potential increases up to the HV potential. In this case, since the high withstand voltage diode DB is reversely biased, the charge current of the high withstand voltage diode DB does not flow. The high-voltage side drive circuit 10a operates using the capacitance CB as a power supply and using the VS potential as a reference potential.

Figure 2:
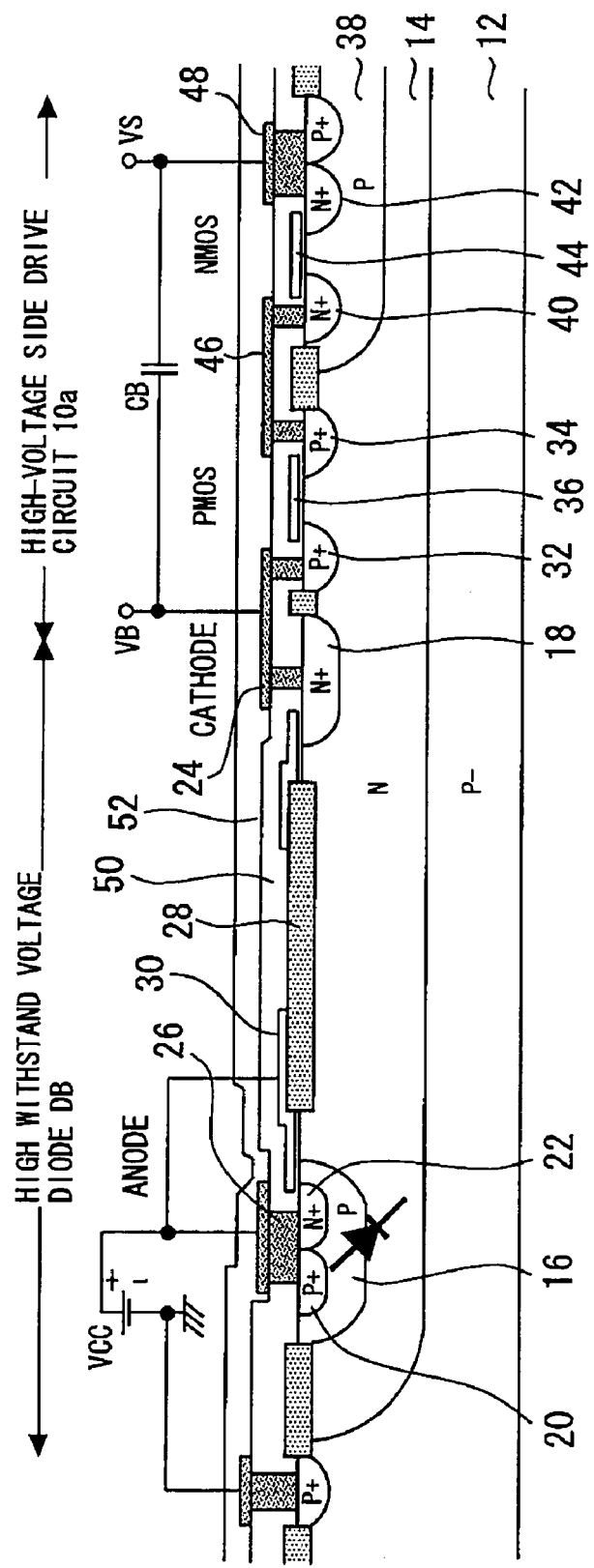
FIG. 2 is a cross-sectional view illustrating the high withstand voltage diode according to First embodiment.

FIG. 2 is a cross-sectional view illustrating the high withstand voltage diode according to First embodiment. The high-voltage side drive circuit 10a is formed on the cathode side of the high withstand voltage diode DB. An N-type cathode region 14 is provided on the surface of a P-type semiconductor substrate 12. This N-type cathode region 14 is the cathode region of the high withstand voltage diode DB and at the same time, is also part of the high-voltage side drive circuit 10a. An N-type embedded diffusion region may also be formed in the high-voltage side drive circuit 10a.

A P-type anode region 16 and an N$^+$-type contact layer 18 are provided in the N-type cathode region 14 in the high withstand voltage diode DB. A P$^+$-type contact region 20 and an N$^+$-type contact region 22 are provided in the P-type anode region 16. A cathode electrode 24 is connected to the N-type cathode region 14 via an N$^+$-type contact layer 18 and an anode electrode 26 is connected to the P$^+$-type contact region 20 and the N$^+$-type contact region 22. Between the anode electrode 26 and the cathode electrode 24, a field oxide film 28 and a field plate 30 are provided on the P$^-$-type semiconductor substrate 12. Although the cross-sectional structure of the high withstand voltage diode DB is similar to that of a DMOS (Double-Diffused MOSFET), the field plate 30 on the low potential side corresponding to the gate electrode is connected to the anode electrode 26 so as not to perform MOS operation.

In the high-voltage side drive circuit 10a, a P$^+$-type source region 32 and a P$^+$-type drain region 34 are provided in the N-type cathode region 14 as PMOS (p-channel MOSFET) and a gate electrode 36 is provided between both regions. A P-type diffusion layer 38 is provided in the N-type cathode region 14. An N$^+$-type drain region 40 and an N$^+$-type source region 42 are provided in the P-type diffusion layer 38 as NMOS (n-channel MOSPET) and a gate electrode 44 is provided between both regions. The P-type diffusion layer 38 serves as a back gate of NMOS.

The cathode electrode 24 is connected to the P$^+$-type source region 32 and an electrode 46 is connected to the P$^+$-type drain region 34 and the N$^+$-type drain region 40 and an electrode 48 is connected to the N$^+$-type source region 42. The cathode electrode 24 is connected to the VB terminal and the electrode 48 is connected to the VS terminal. The capacitor CB is connected between both terminals.

The field plate 30 and the gate electrodes 36 and 44 are covered with an inter-layer oxide film 50. The cathode electrode 24, anode electrode 26 and electrodes 46 and 48 are covered with a passivation film 52. The field plate 30 and the gate electrodes 36 and 44 are polysilicon layers. The cathode electrode 24, anode electrode 26 and electrodes 46 and 48 are aluminum electrodes.

Figure 3:
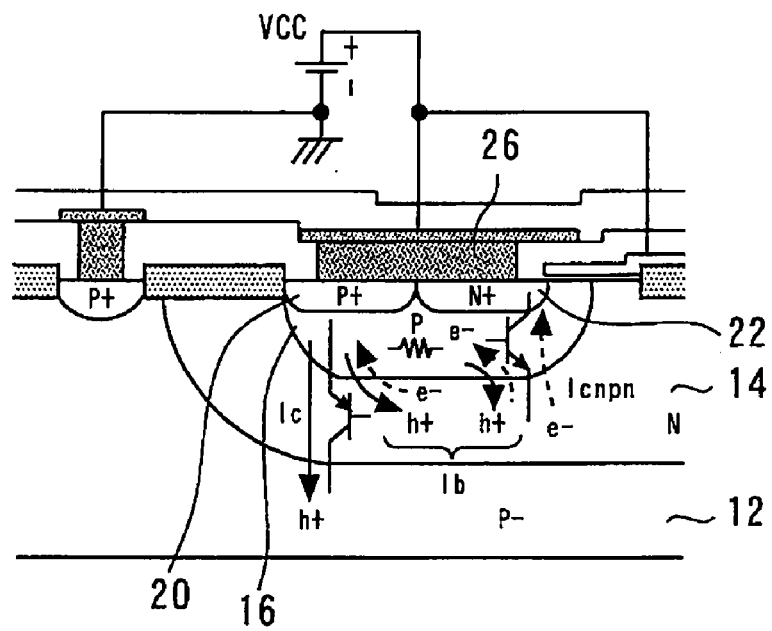
FIG. 3 is a cross-sectional view illustrating a charge operation of the high withstand voltage diode according to First embodiment.

FIG. 3 is a cross-sectional view illustrating a charge operation of the high withstand voltage diode according to First embodiment. When the VS potential is decreased close to the GND potential, the high withstand voltage diode DB is forward-biased and the high withstand voltage diode DB performs a charge operation on the capacitor CB.

A forward current Ib that flows into the high withstand voltage diode DB in this case also becomes a base current of a parasitic PNP transistor made up of the P$^-$-type semiconductor substrate 12, N-type cathode region 14 and P-type anode region 16. Thus, a collector current Ic of the parasitic PNP transistor flows from the P-type anode region 16 into the P$^-$-type semiconductor substrate 12. The collector current Ic only flows into GND and becomes a simple loss that has no contribution to the IC operation. The loss Pw is expressed by the following equation.

$$Pw = Ic \times VCC = hFE \times Ib \times VCC \quad \text{(Equation 5)}$$

Here, hFE denotes a current gain of the parasitic PNP transistor. VCC is constant and is normally hFE>1.

Furthermore, the current Ib also becomes a base current of a parasitic NPN transistor made up of the N-type cathode region 14, P-type anode region 16 and N$^+$-type contact region 22. For this reason, a collector current Icnpn of the parasitic NPN transistor flows.

$$Icnpn = hFEn \times Ib \quad \text{(Equation 6)}$$

where, hFEn denotes a current gain of the parasitic NPN transistor.

A charge current Ich supplied to the capacitor CB is expressed by the following equation.

$$Ich = Ib + Icnpn = Ib(1 + hFEn) \quad \text{(Equation 7)}$$

Furthermore, a power Pb supplied to the capacitor CB is expressed by the following equation.

$$Pb = Ich \times (VC - VB - VS - VF) \quad \text{(Equation 8)}$$

Figure 4:
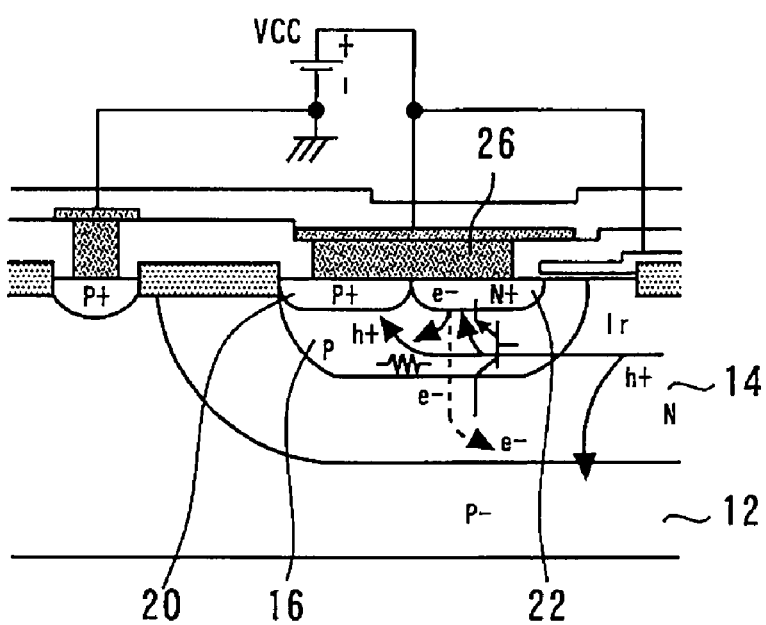
FIG. 4 is a cross-sectional view illustrating a recovery operation of the high withstand voltage diode according to First embodiment.

FIG. 4 is a cross-sectional view illustrating a recovery operation of the high withstand voltage diode according to First embodiment. When the VS potential becomes a high potential through an inverter operation, the high withstand voltage diode DB is reversely biased and the charge operation of the high withstand voltage diode DB is completed. Holes injected into the N-type cathode region 14 flow into the P$^-$-type semiconductor substrate 12 and the P-type anode region 16 at the GND potential accompanying the formation of a depletion layer and a recovery current Ir is generated. In this case, a current flows into the P-type anode region 16 located below the N$^+$-type contact region 22 and a potential difference is generated by the parasitic resistance component thereof, and therefore a forward current flows from the P-type anode region 16 to the N$^+$-type contact region 22. The forward current becomes a base current of the parasitic NPN transistor. For this reason, a collector current of the parasitic NPN transistor flows from the N-type cathode region 14 to the N$^+$-type contact region 22.

Figure 5:
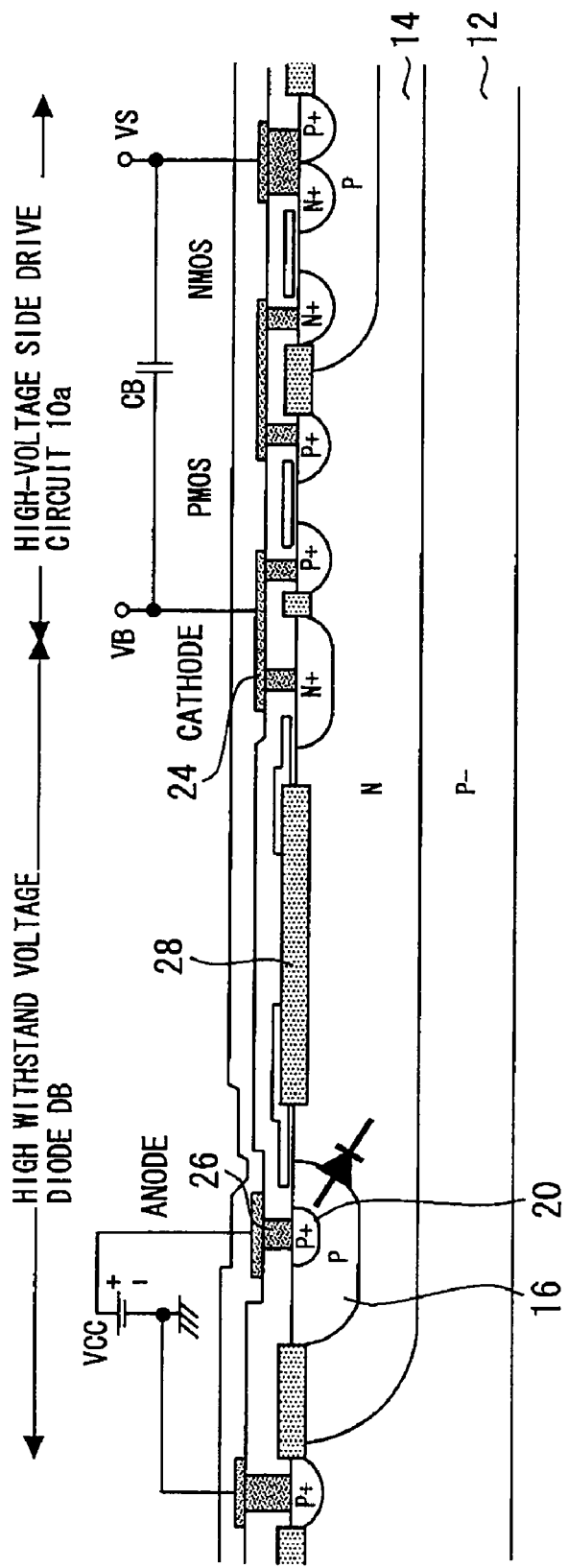
FIG. 5 is a cross-sectional view illustrating a high withstand voltage diode according to a comparative example.
Figure 6:
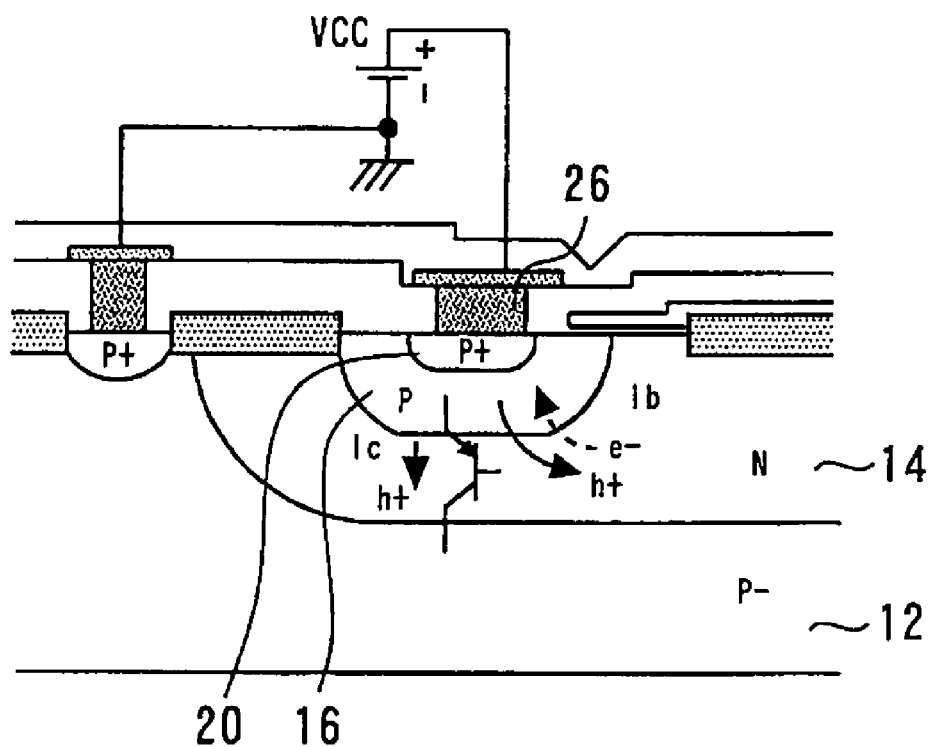
FIG. 6 is a cross-sectional view illustrating a charge operation of the high withstand voltage diode according to the comparative example.

Next, effects of First embodiment will be described in comparison with a comparative example. FIG. 5 is a cross-sectional view illustrating a high withstand voltage diode according to a comparative example. FIG. 6 is a cross-sectional view illustrating a charge operation of the high withstand voltage diode according to the comparative example. The comparative example has no N$^+$-type contact region 22. Therefore, no parasitic NPN transistor exists, and for this reason, the charge current Ich=Ib. Therefore, Pw>Pb from Equation 5 and Equation 8 and loss Pw equal to or above the power Pb supplied to the capacitor CB is generated.

On the other hand, in First embodiment, since the N$^+$-type contact region 22 is provided in the P-type anode region 16, the N-type cathode region 14, P-type anode region 16 and N$^+$-type contact region 22 constitute a parasitic NPN transistor. The collector current Icnpn of the parasitic NPN transistor becomes part of the charge current Ich and does not become a base current of the parasitic PNP transistor. Therefore, when the same charge current Ich is obtained, loss Pw can be reduced compared to the comparative example. To be more specific, since normally hFEn>1 in Equation 7, when the same charge current Ich is obtained, the current Ib can be reduced to ½ or less compared to the comparative example. Therefore, the loss Pw in Equation 5 can also be reduced to ½ or less. Thus, First embodiment can reduce power consumption.

Second Embodiment

Figure 7:
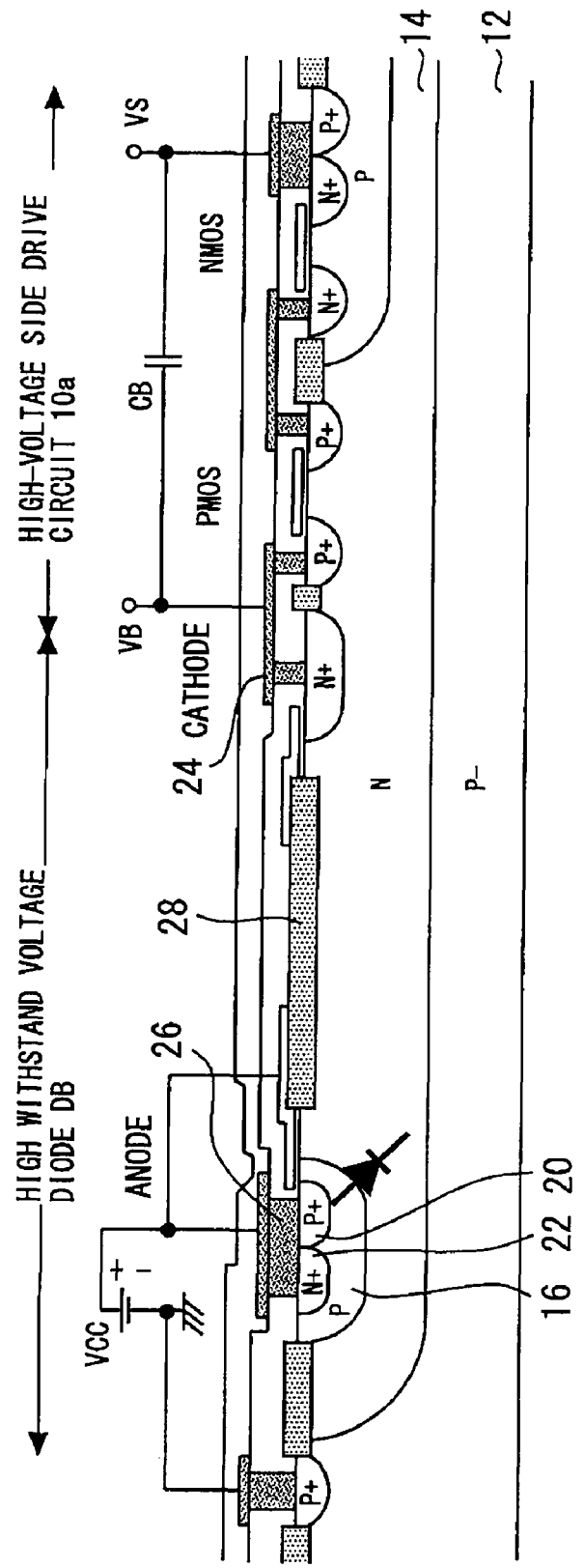
FIG. 7 is a cross-sectional view illustrating a high withstand voltage diode according to Second embodiment.

FIG. 7 is a cross-sectional view illustrating a high withstand voltage diode according to Second embodiment. When compared to First embodiment, the positions of the P$^+$-type contact region 20 and the N$^+$-type contact region 22 are reversed. Therefore, the P$^+$-type contact region 20 is closer to the cathode electrode 24 than the N$^+$-type contact region 22.

Figure 8:
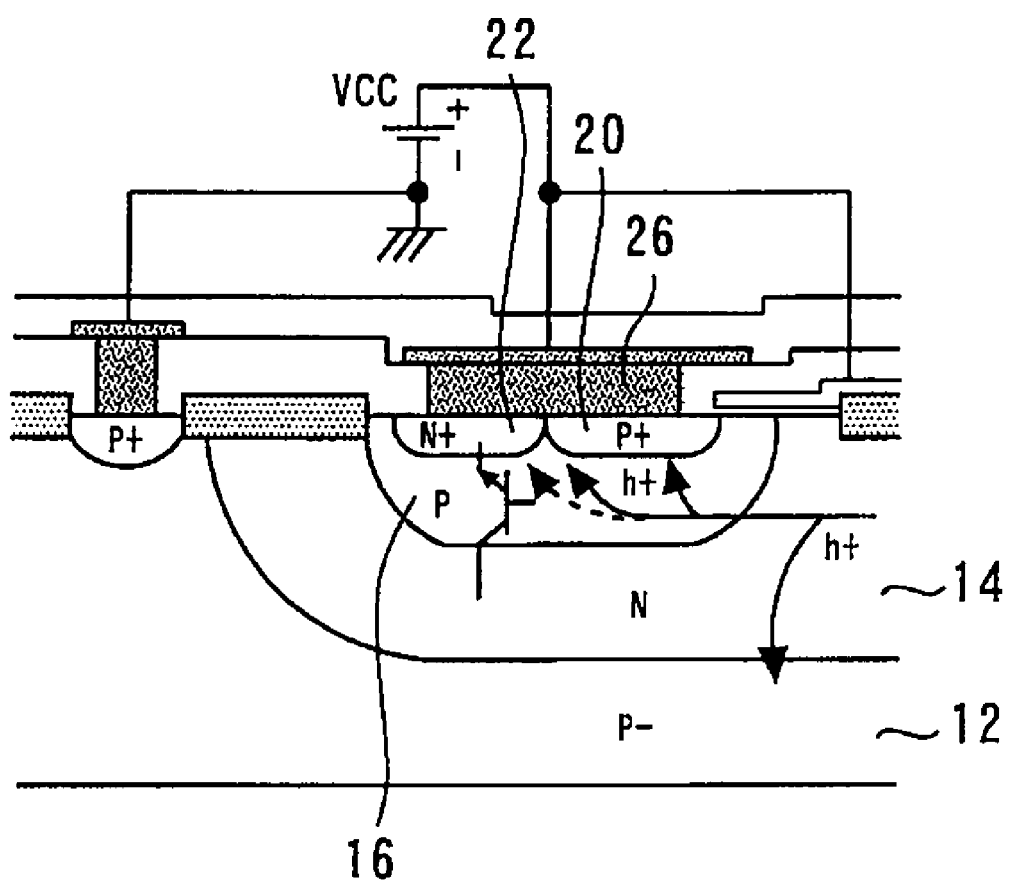
FIG. 8 is a cross-sectional view illustrating a recovery operation of the high withstand voltage diode according to Second embodiment.

FIG. 8 is a cross-sectional view illustrating a recovery operation of the high withstand voltage diode according to Second embodiment. During the recovery operation, holes flow from the N-type cathode region 14 into the P-type anode region 16. The holes that have flown into the P-type anode region 16 reach the anode electrode 26 via the P$^+$-type contact region 20. For this reason, unlike First embodiment, substantially no current flows into the P-type anode region 16 located below the N$^+$-type contact region 22, and therefore the operation of the parasitic NPN transistor during the recovery operation can be suppressed. Even when the VB potential becomes high potential, it is possible to prevent the NPN transistor from being destroyed by a secondary breakdown phenomenon.

Third Embodiment

Figure 9:
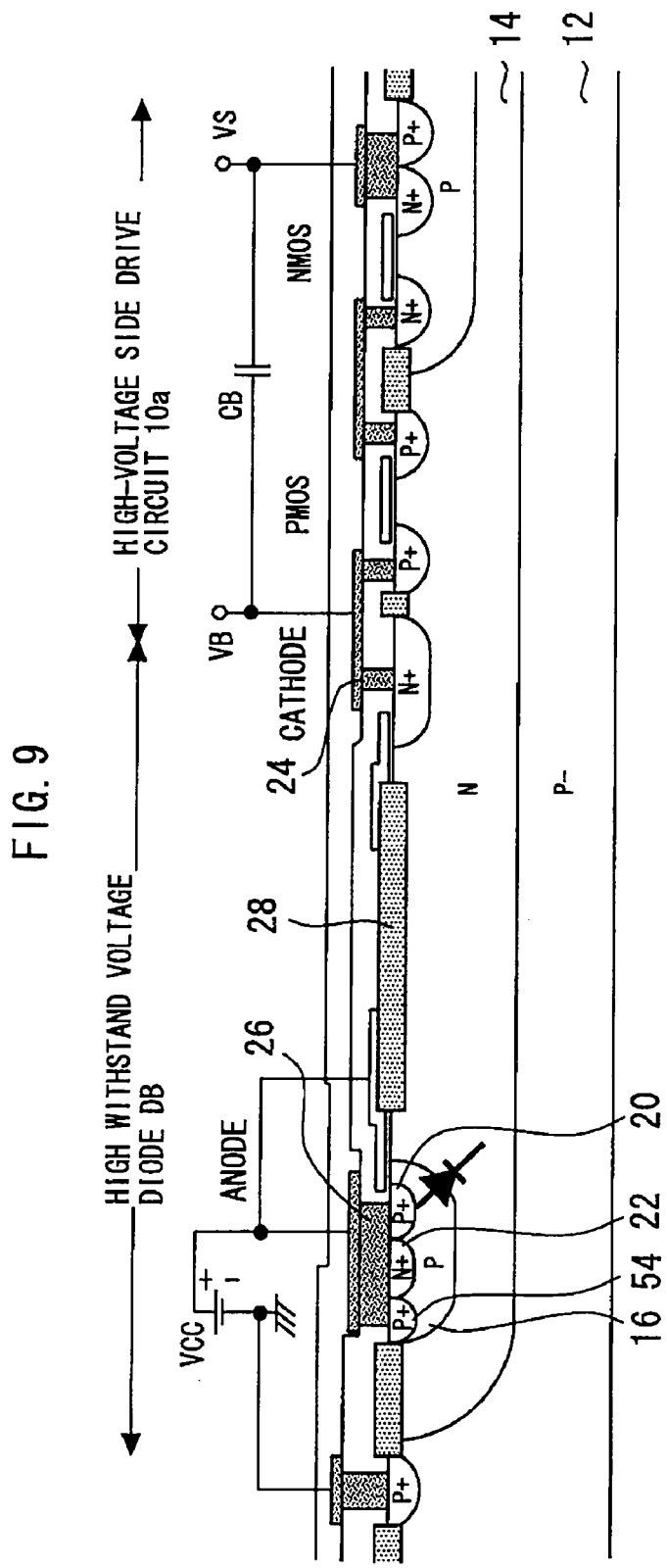
FIG. 9 is a cross-sectional view illustrating a high withstand voltage diode according to Third embodiment.

FIG. 9 is a cross-sectional view illustrating a high withstand voltage diode according to Third embodiment. In addition to the configuration of Second embodiment, a P⁺-type contact region 54 is provided farther from the cathode electrode 24 than the N⁺-type contact region 22.

Figure 10:
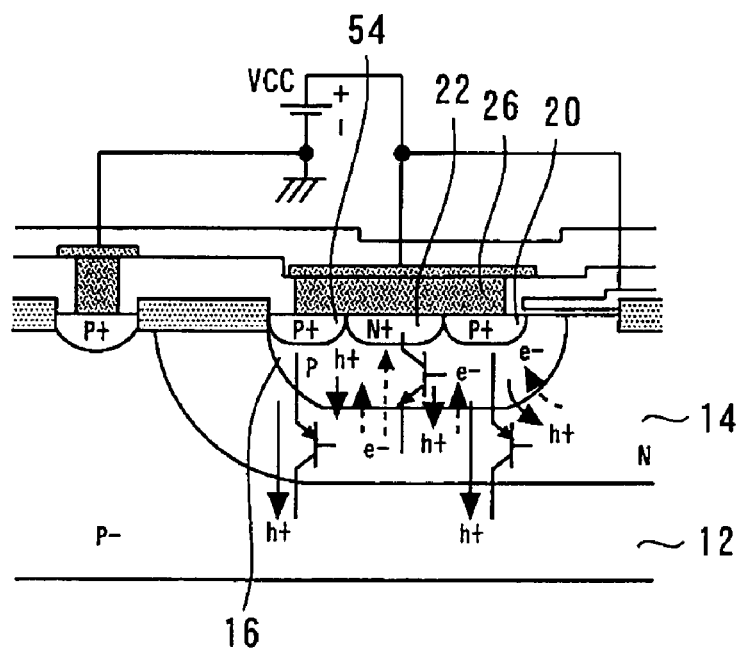
FIG. 10 is a cross-sectional view illustrating a charge operation of the high withstand voltage diode according to Third embodiment.

FIG. 10 is a cross-sectional view illustrating a charge operation of the high withstand voltage diode according to Third embodiment. During the charge operation, holes are injected into the N-type cathode region 14 from the Pt-type contact region 54 through the P-type anode region 16 and the parasitic NPN transistor operates. Therefore, contribution to the charge current of the parasitic NPN transistor can be improved more than Second embodiment.

Figure 11:
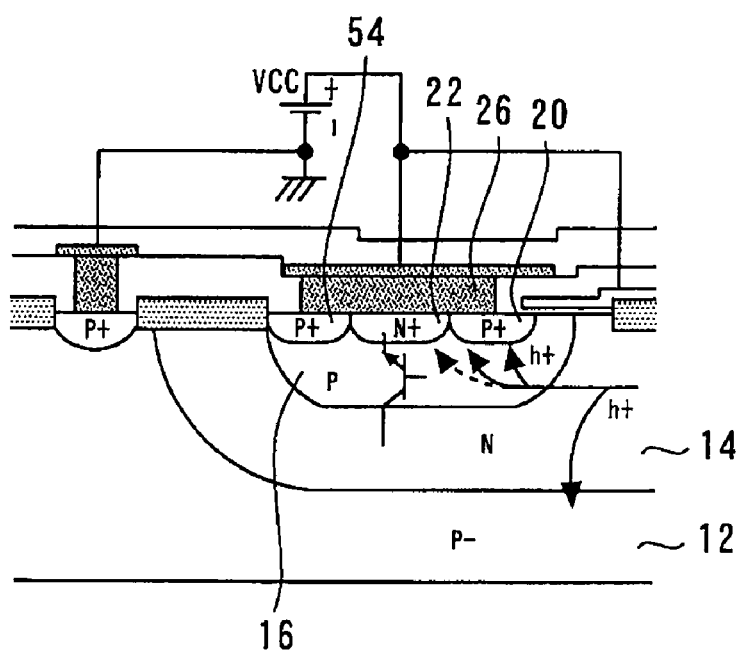
FIG. 11 is a cross-sectional view illustrating a recovery operation of the high withstand voltage diode according to Third embodiment.

FIG. 11 is a cross-sectional view illustrating a recovery operation of the high withstand voltage diode according to Third embodiment. During the recovery operation, holes that have flown into the P-type anode region 16 reach the anode electrode 26 via the P⁺-type contact region 20. Thus, it is possible to suppress the operation of the parasitic NPN transistor and prevent the NPN transistor from being destroyed during the recovery operation in the same way as in Second embodiment.

Fourth Embodiment

Figure 12:
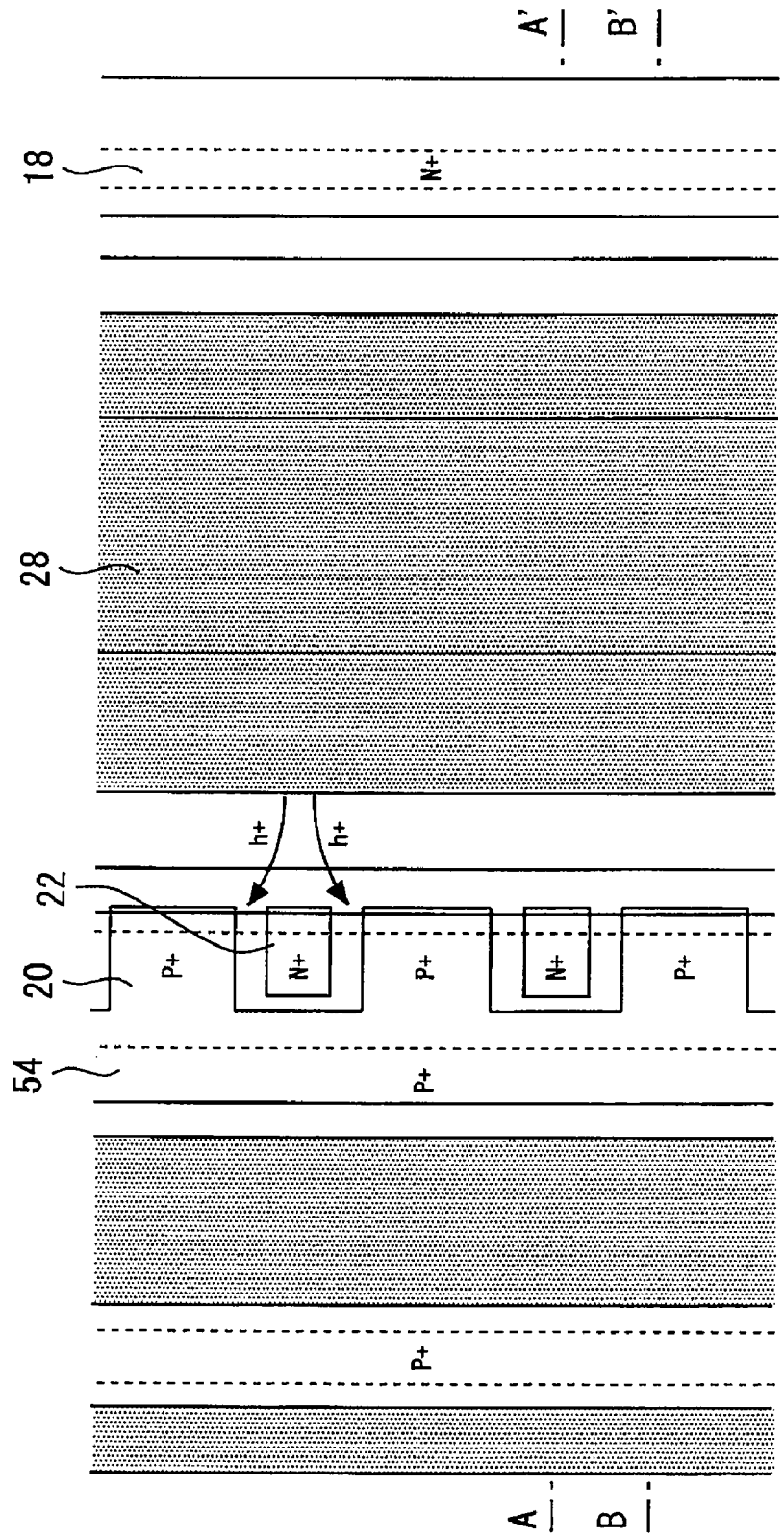
FIG. 12 is a plan view illustrating a high withstand voltage diode according to Fourth embodiment.
Figure 13:
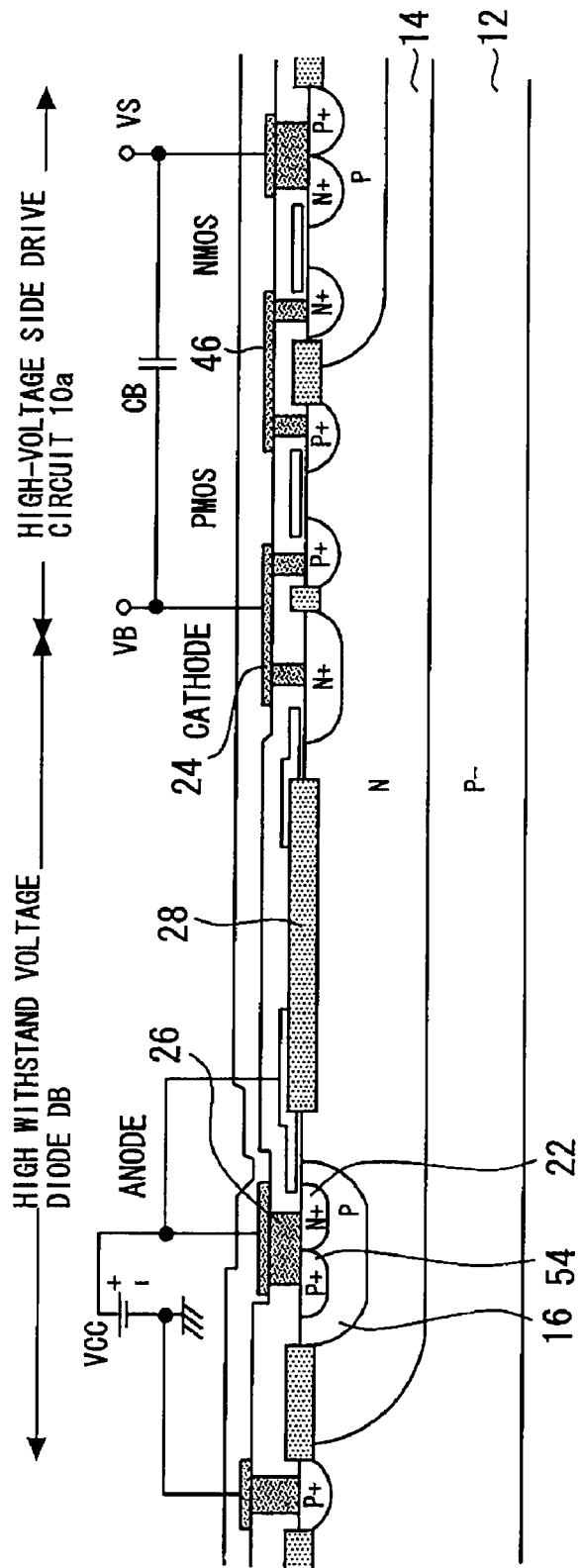
FIG. 13 is a cross-sectional view along A-A' of FIG. 12.
Figure 14:
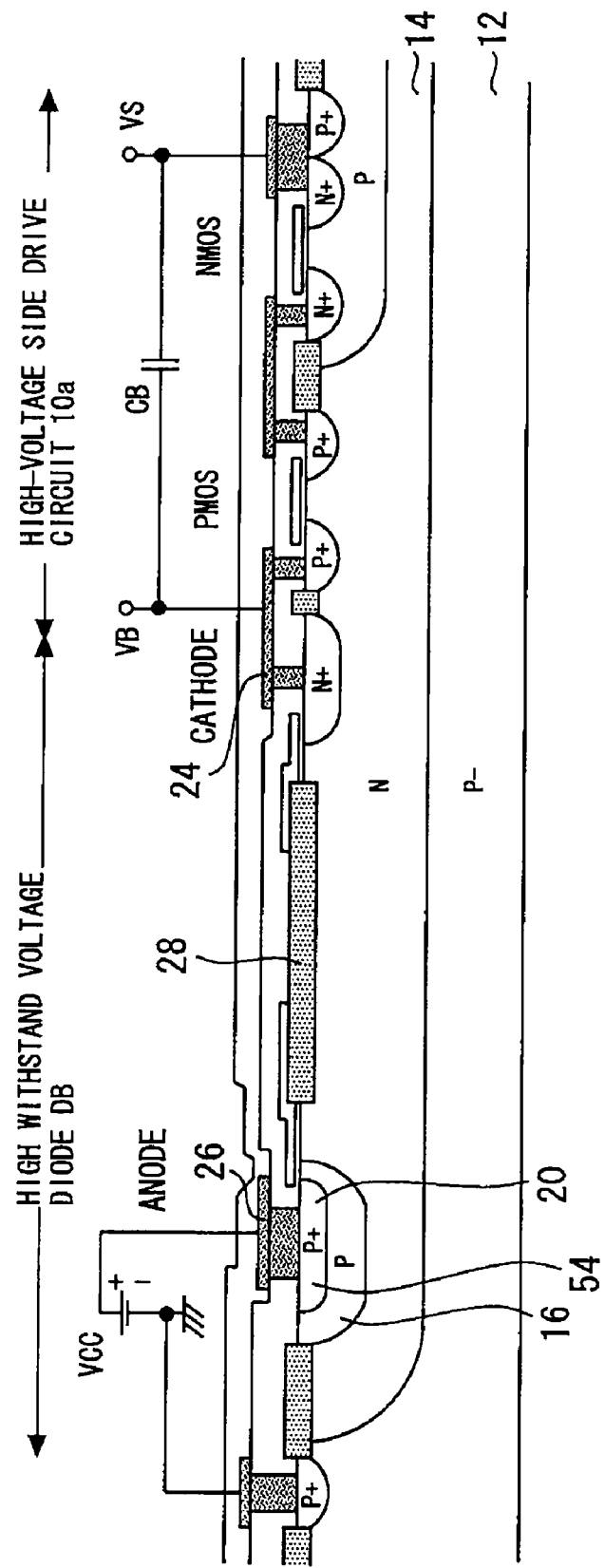
FIG. 14 is a cross-sectional view along B-B' of FIG. 12.

FIG. 12 is a plan view illustrating a high withstand voltage diode according to Fourth embodiment. FIG. 13 is a cross-sectional view along A-A' of FIG. 12. FIG. 14 is a cross-sectional view along B-B' of FIG. 12. The P⁺-type contact regions 20 and the N⁺-type contact regions 22 are alternately arranged in a direction perpendicular to the direction from the anode electrode 26 to the cathode electrode 24 on the surface of the P⁻-type semiconductor substrate 12. A P⁺-type contact region 54 is provided at a position farther from the cathode electrode 24 than the plurality of P⁺-type contact regions 20 and the plurality of N⁺-type contact regions 22.

Figure 15:
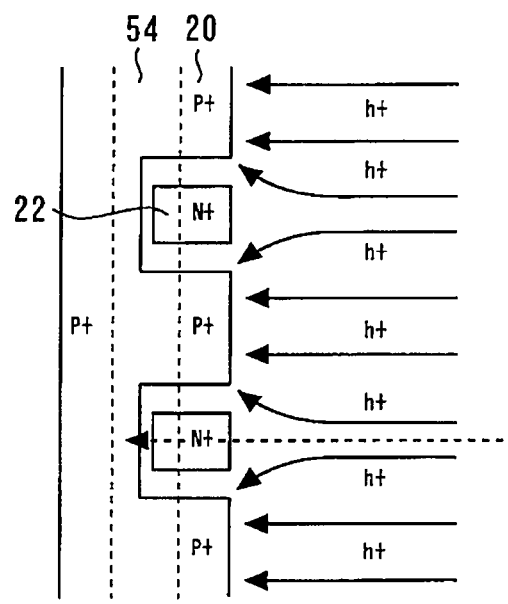
FIG. 15 is a plan view illustrating a recovery operation of the high withstand voltage diode according to Fourth embodiment.

FIG. 15 is a plan view illustrating a recovery operation of the high withstand voltage diode according to Fourth embodiment. During the recovery operation, holes flow from the N-type cathode region 14 into the P-type anode region 16. In this case, holes do not flow into the P-type anode region 16 below the N⁺-type contact region 22 having large parasitic resistance but flow into the P⁺-type contact region 20 arranged on both sides of the N⁺-type contact region 22. Thus, it is possible to suppress the operation of the parasitic NPN transistor during the recovery operation and prevent the NPN transistor from being destroyed in the same way as in Second embodiment.

Fifth Embodiment

Figure 16:
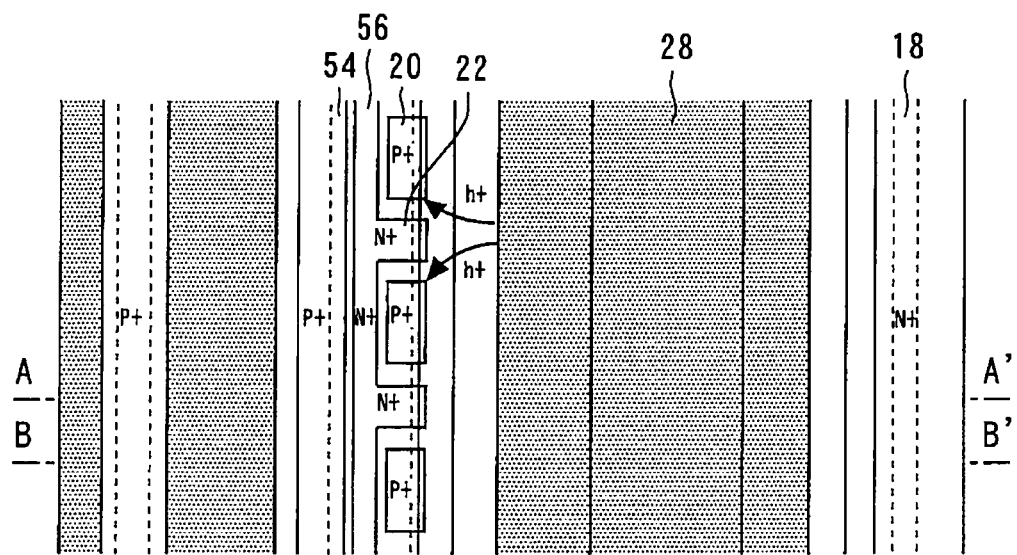
FIG. 16 is a plan view illustrating a high withstand voltage diode according to Fifth embodiment.
Figure 17:
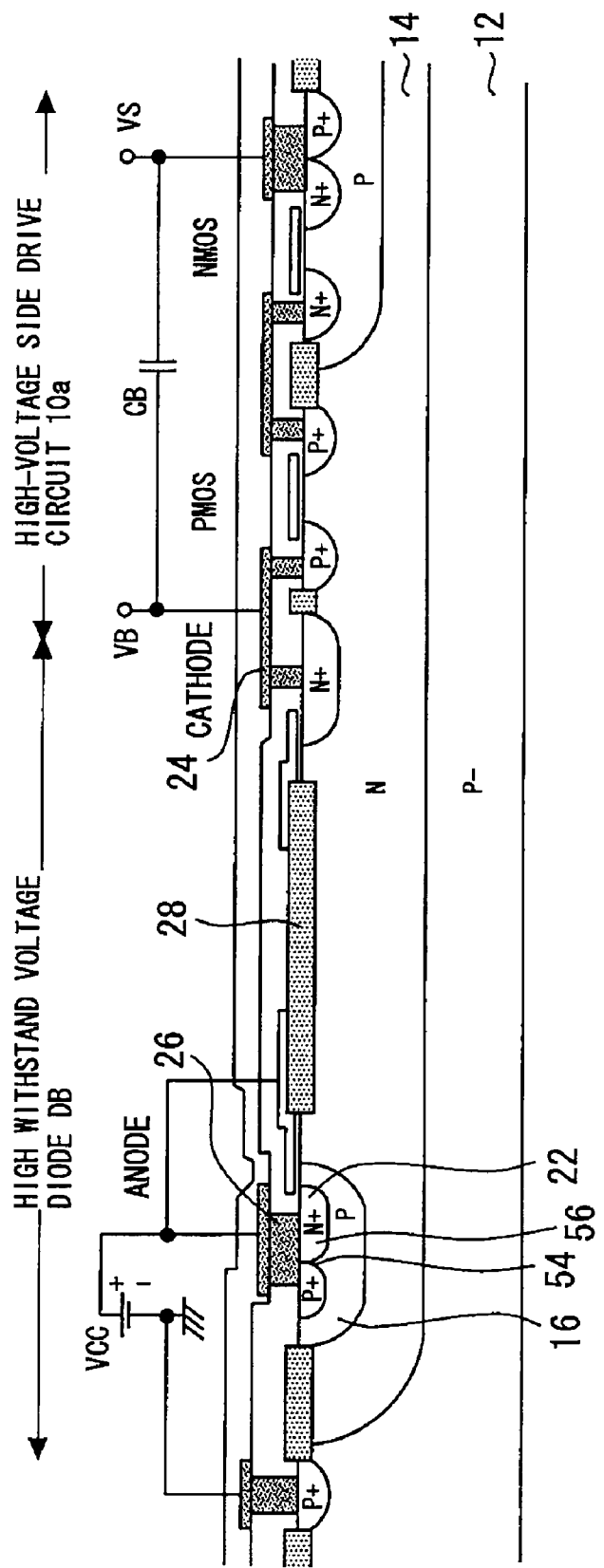
FIG. 17 is a cross-sectional view along A-A' of FIG. 16.
Figure 18:
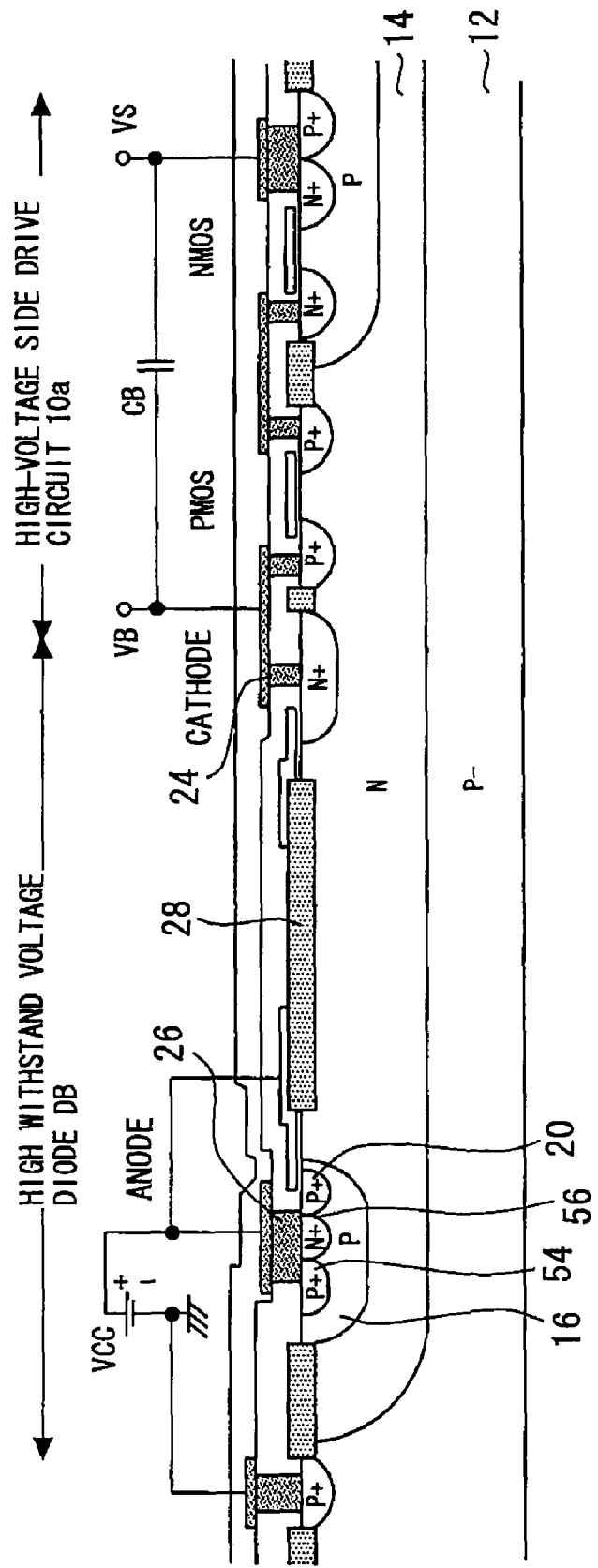
FIG. 18 is a cross-sectional view along B-B' of FIG. 16.

FIG. 16 is a plan view illustrating a high withstand voltage diode according to Fifth embodiment. FIG. 17 is a cross-sectional view along A-A' of FIG. 16. FIG. 18 is a cross-sectional view along B-B' of FIG. 16. In addition to the configuration of Fourth embodiment, an N⁺-type contact region 56 is provided at a position farther from the cathode electrode 24 than the plurality of P⁺-type contact regions 20 and the plurality of N⁺-type contact regions 22. The P⁺-type contact region 54 is farther from the cathode electrode 24 than the N⁺-type contact region 56.

During a charge operation, holes are injected into the N-type cathode region 14 from the P⁺-type contact region 54 through the P-type anode region 16 and the parasitic NPN transistor operates. Therefore, contribution to the charge current of the parasitic NPN transistor can be improved compared to Fourth embodiment.

During a recovery operation, holes flow from the N-type cathode region 14 into the P-type anode region 16. In this case, holes do not flow into the P-type anode region 16 below the N⁺-type contact region 22 having large parasitic resistance, but flow into the P⁺-type contact region 20 disposed on both sides of the N⁺-type contact region 22. Thus, it is possible to suppress the operation of the parasitic NPN transistor and prevent the NPN transistor from being destroyed during the recovery operation in the same way as in Fourth embodiment.

Sixth Embodiment

Figure 19:
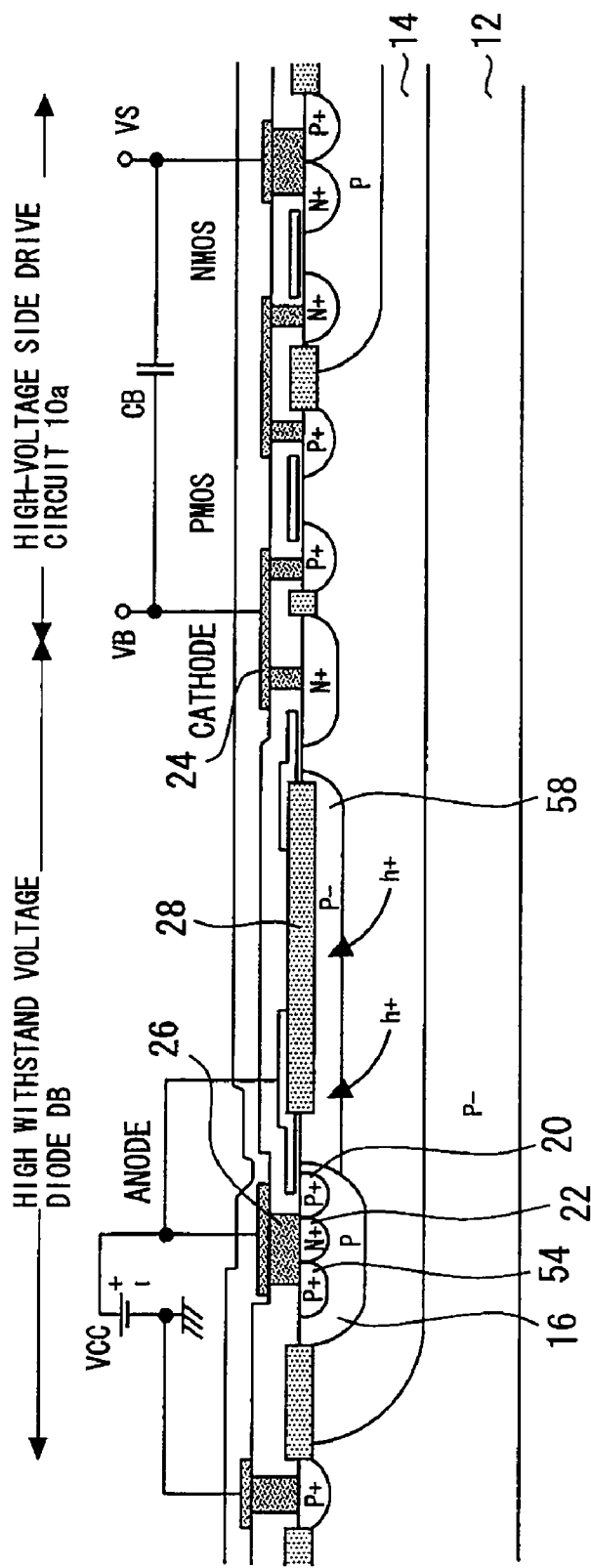
FIG. 19 is a cross-sectional view illustrating a high withstand voltage diode according to Sixth embodiment.

FIG. 19 is a cross-sectional view illustrating a high withstand voltage diode according to Sixth embodiment. In addition to the configuration of Third embodiment, a P⁻-type voltage holding region 58 is provided in the N-type cathode region 14, which is connected to the P-type anode region 16 and extends to below the field oxide film 28. When a high potential is applied to the cathode electrode 24, a depletion layer is formed from the cathode side to the anode side in the P⁻-type voltage holding region 58 and a high voltage is held. Likewise, a depletion layer is formed from the anode side to the cathode side in the N-type cathode region 14 and a high voltage is held.

During a recovery operation, holes injected into the N-type cathode region 14 from the P-type anode region 16 or P⁻-type voltage holding region 58 reach the anode electrode 26 via the P⁻-type voltage holding region 58 and P⁺-type contact region 20 accompanying the formation of a depletion layer. For this reason, it is possible to suppress the operation of the parasitic NPN transistor and prevent the NPN transistor from being destroyed during the recovery operation.

Seventh Embodiment

Figure 20:
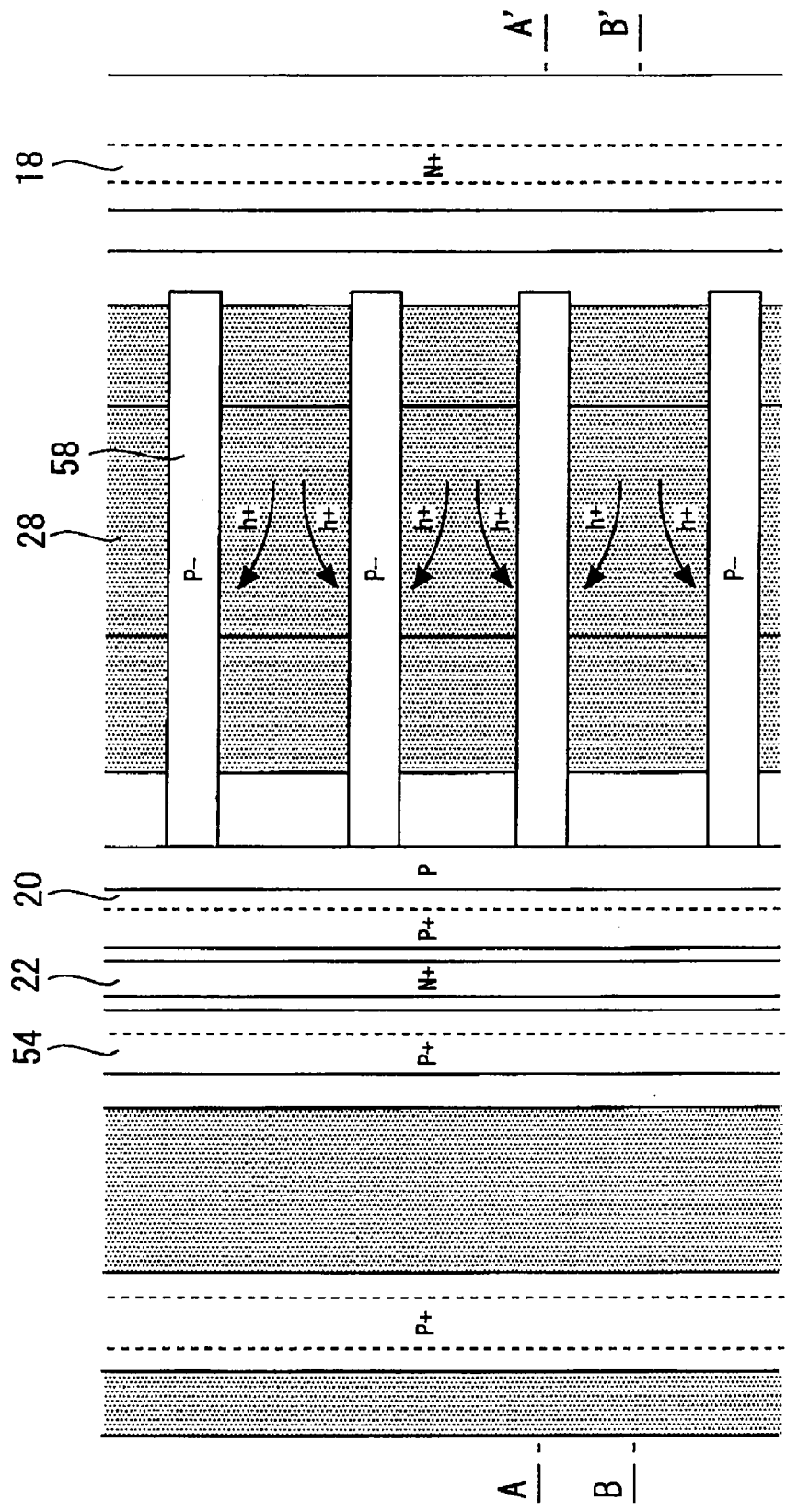
FIG. 20 is a plan view illustrating a high withstand voltage diode according to Seventh embodiment.
Figure 21:
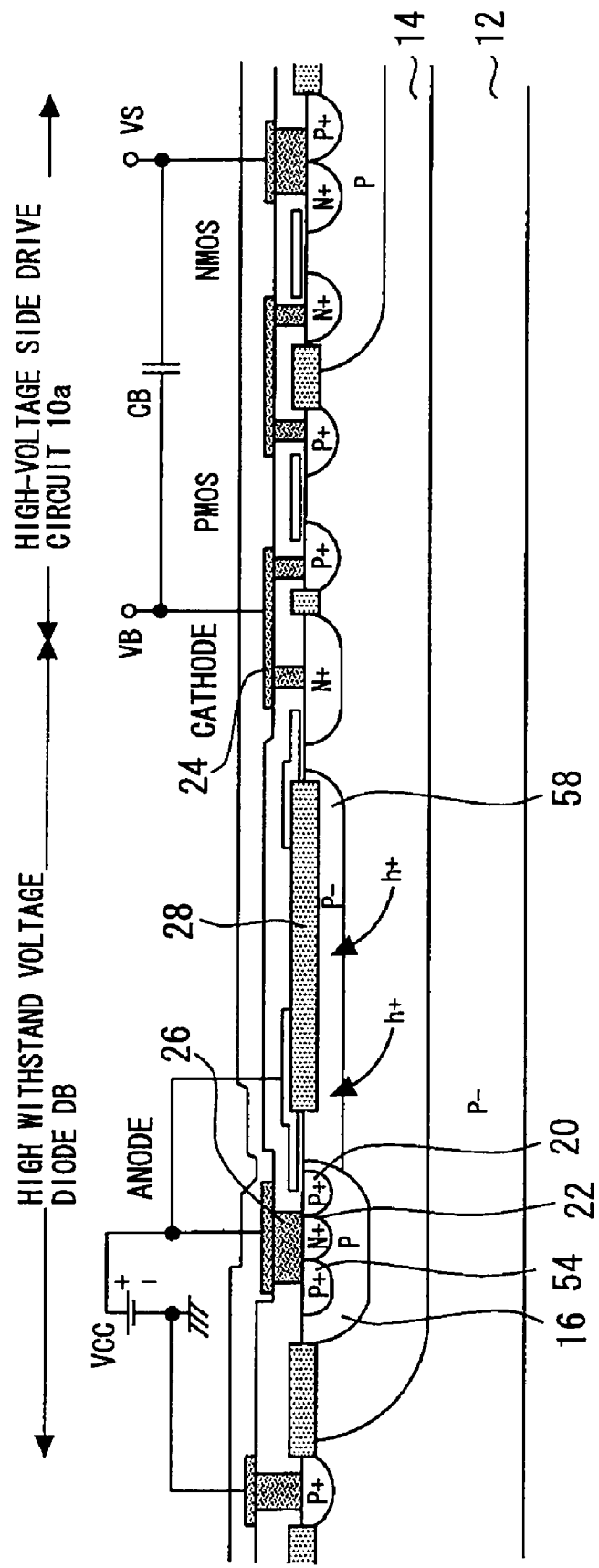
FIG. 21 is a cross-sectional view along A-A' of FIG. 20.
Figure 22:
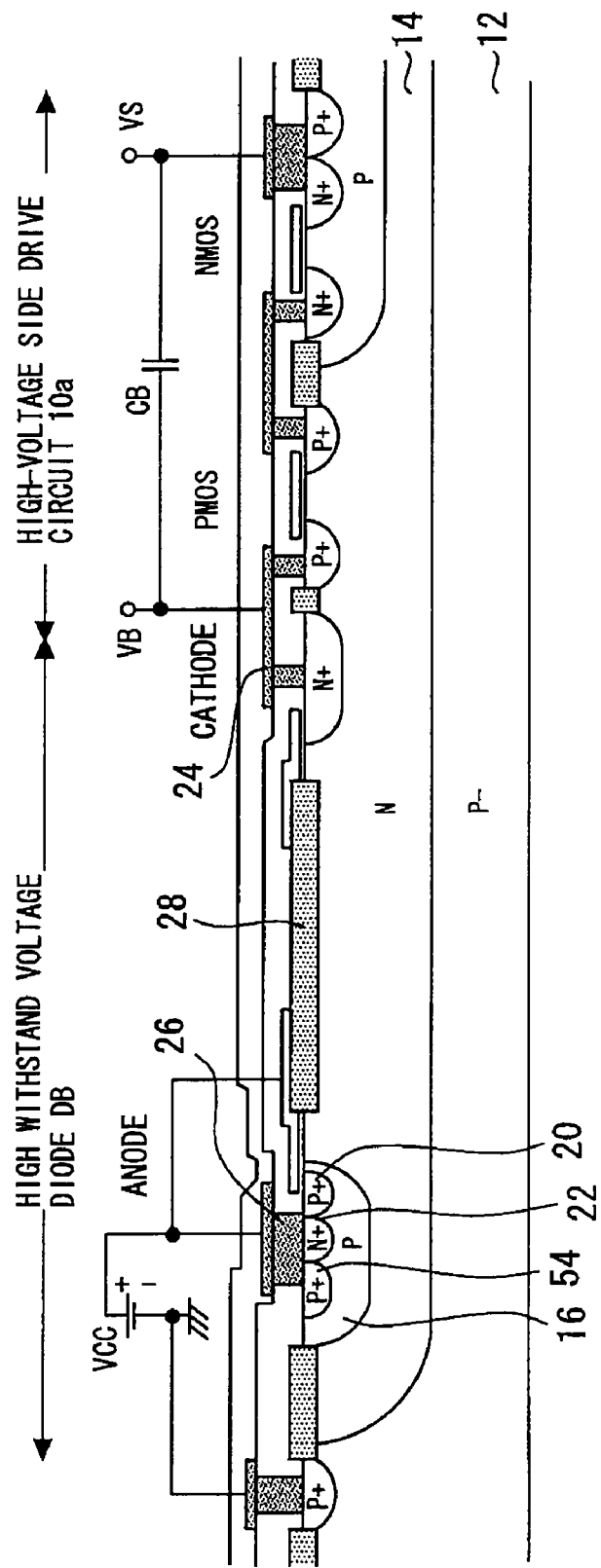
FIG. 22 is a cross-sectional view along B-B' of FIG. 20.

FIG. 20 is a plan view illustrating a high withstand voltage diode according to Seventh embodiment. FIG. 21 is a cross-sectional view along A-A' of FIG. 20. FIG. 22 is a cross-sectional view along B-B' of FIG. 20. The P⁻-type voltage holding region 58 has a plurality of stripe-shaped regions. The plurality of stripe-shaped regions are arranged parallel to each other at equal distances along a direction perpendicular to the direction from the anode electrode 26 to the cathode electrode 24 on the surface of the P⁻-type semiconductor substrate 12.

This improves tradeoff between a withstand voltage that can be held by the P⁻-type voltage holding region 58 and a resistance value of the P⁻-type voltage holding region 58, causes holes to be effectively absorbed, and can thereby effectively suppress the operation of the parasitic NPN during a recovery operation.

Eighth Embodiment

Figure 23:
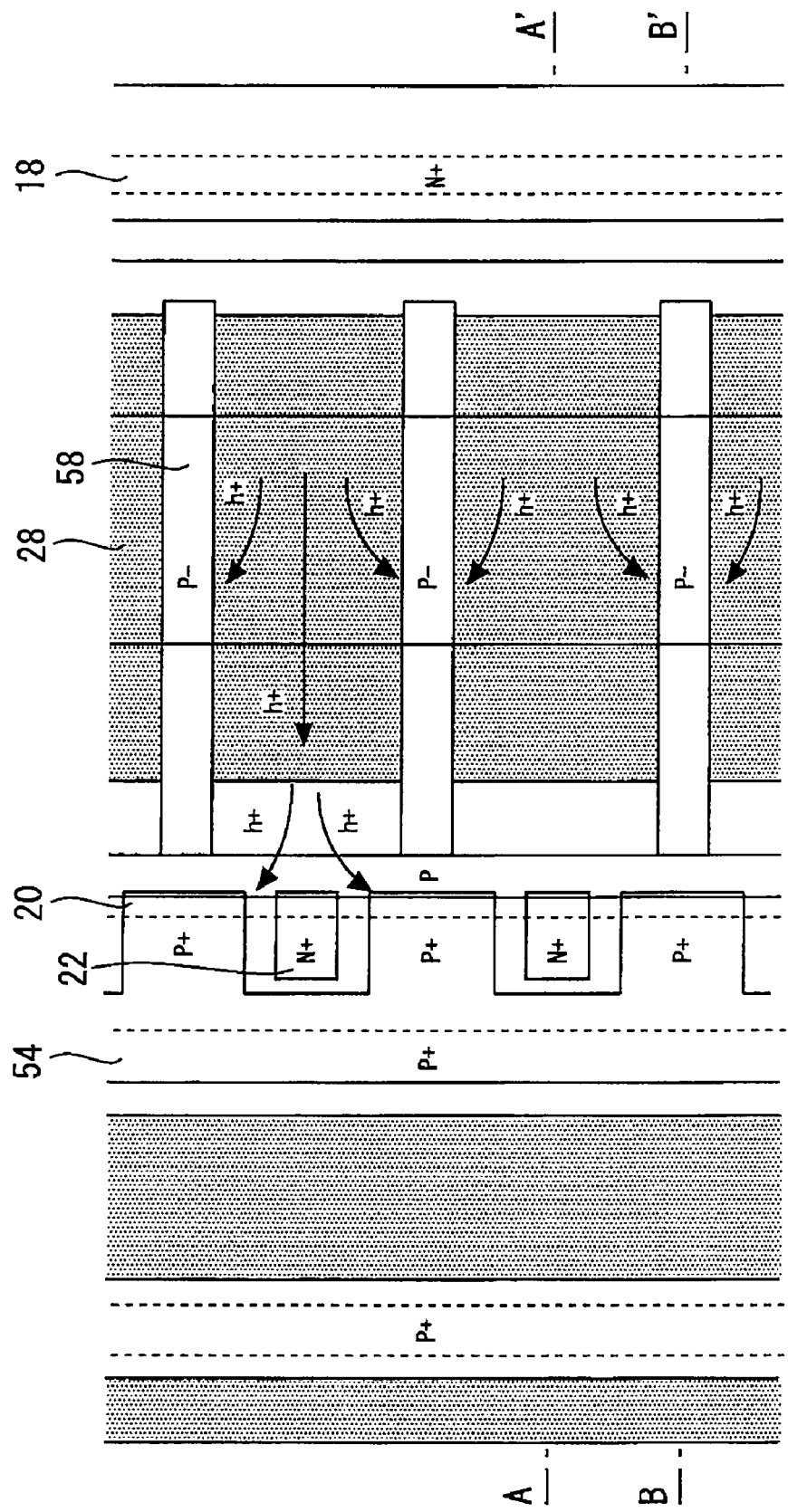
FIG. 23 is a plan view illustrating a high withstand voltage diode according to Eighth embodiment.
Figure 24:
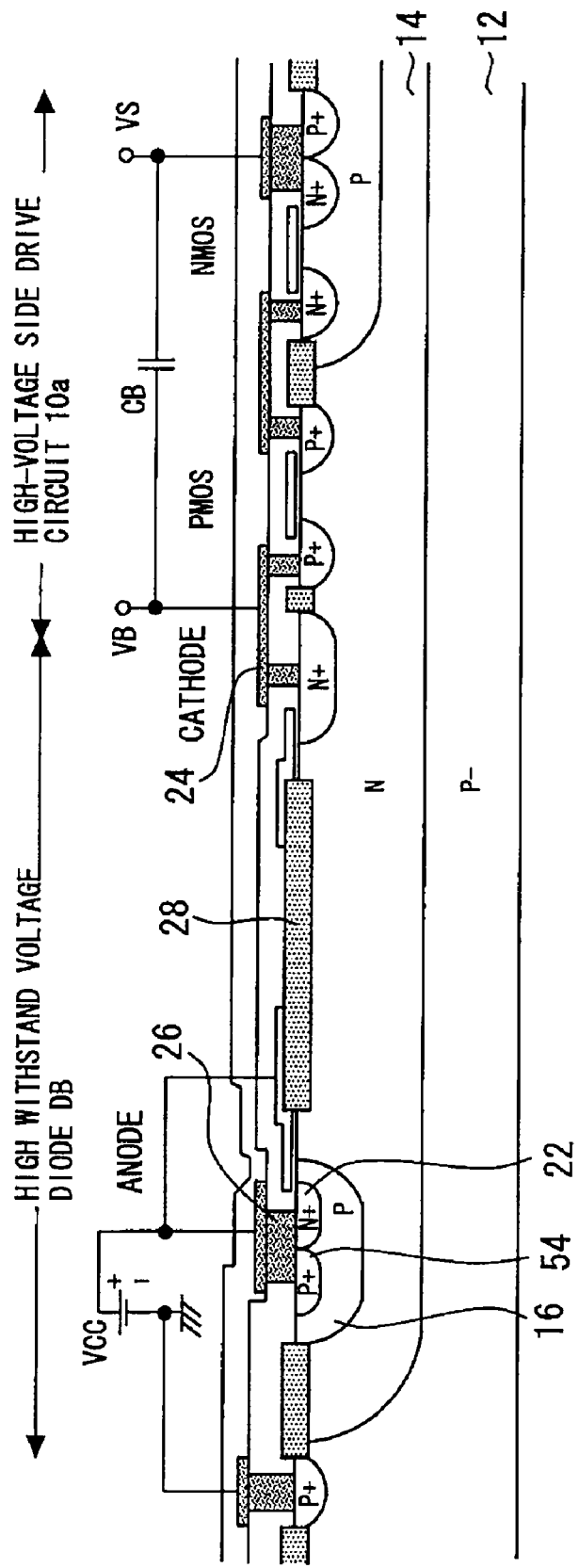
FIG. 24 is a cross-sectional view along A-A' of FIG. 23.
Figure 25:
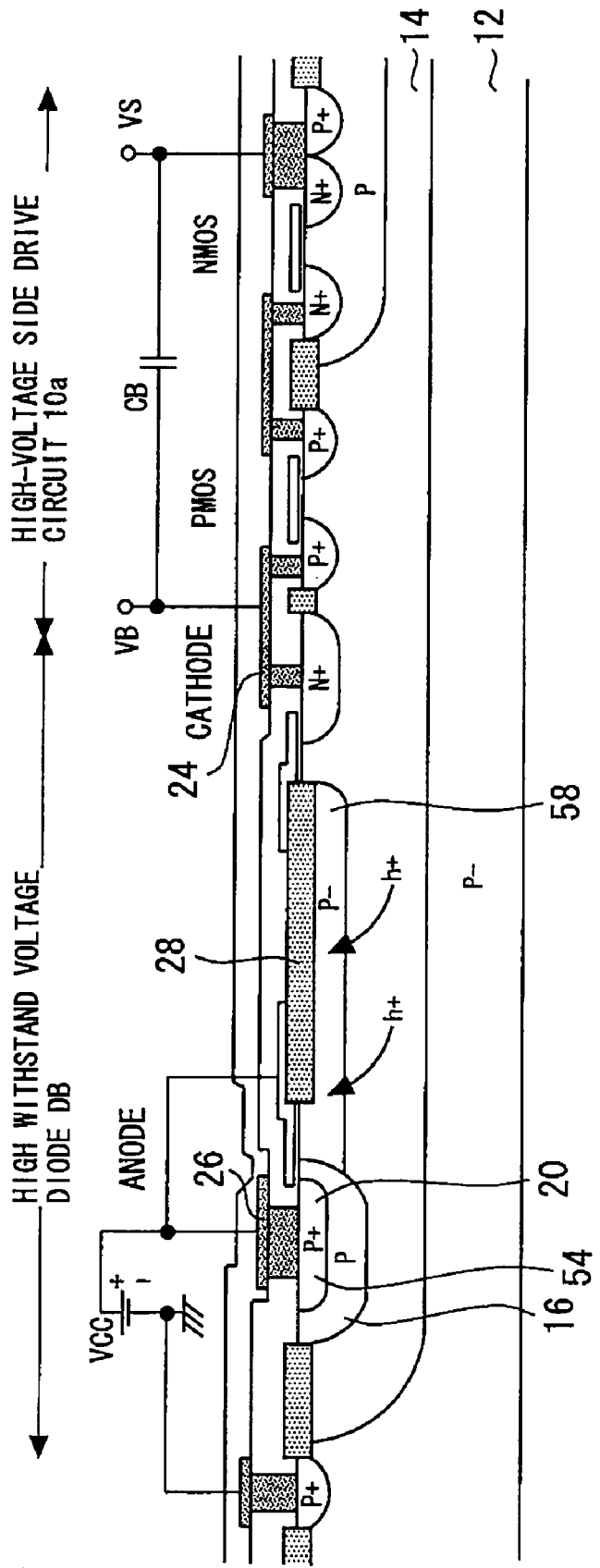
FIG. 25 is a cross-sectional view along B-B' of FIG. 23.

FIG. 23 is a plan view illustrating a high withstand voltage diode according to Eighth embodiment. FIG. 24 is a cross-sectional view along A-A' of FIG. 23. FIG. 25 is a cross-sectional view along B-B' of FIG. 23. In addition to the configuration of Fourth embodiment, the plurality of stripe-shaped P⁻-type voltage holding regions 58 of Seventh embodiment are provided. This allows the effects of Fourth embodiment and Seventh embodiment to be obtained.

Ninth Embodiment

Figure 26:
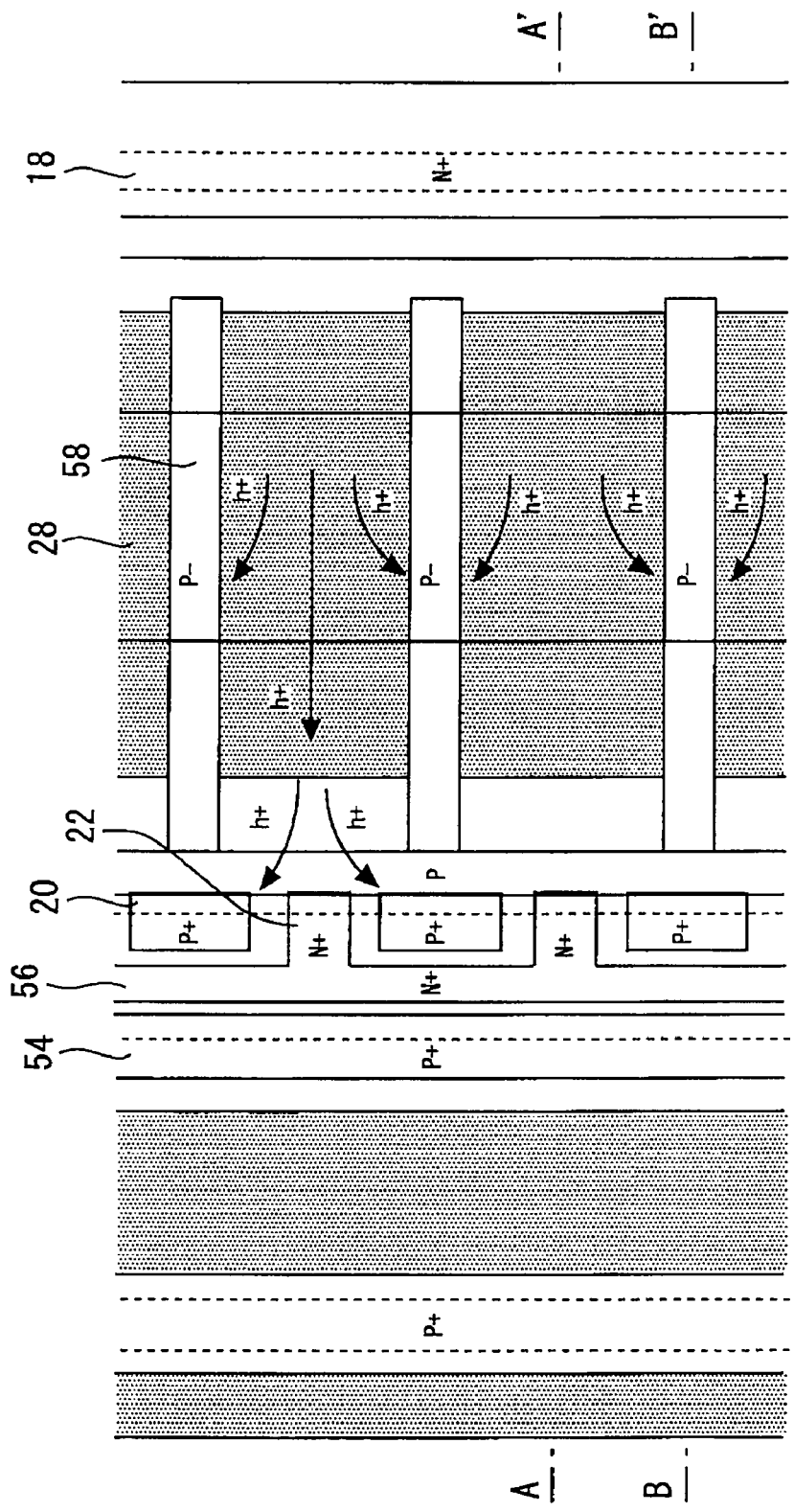
FIG. 26 is a plan view illustrating a high withstand voltage diode according to Ninth embodiment.
Figure 27:
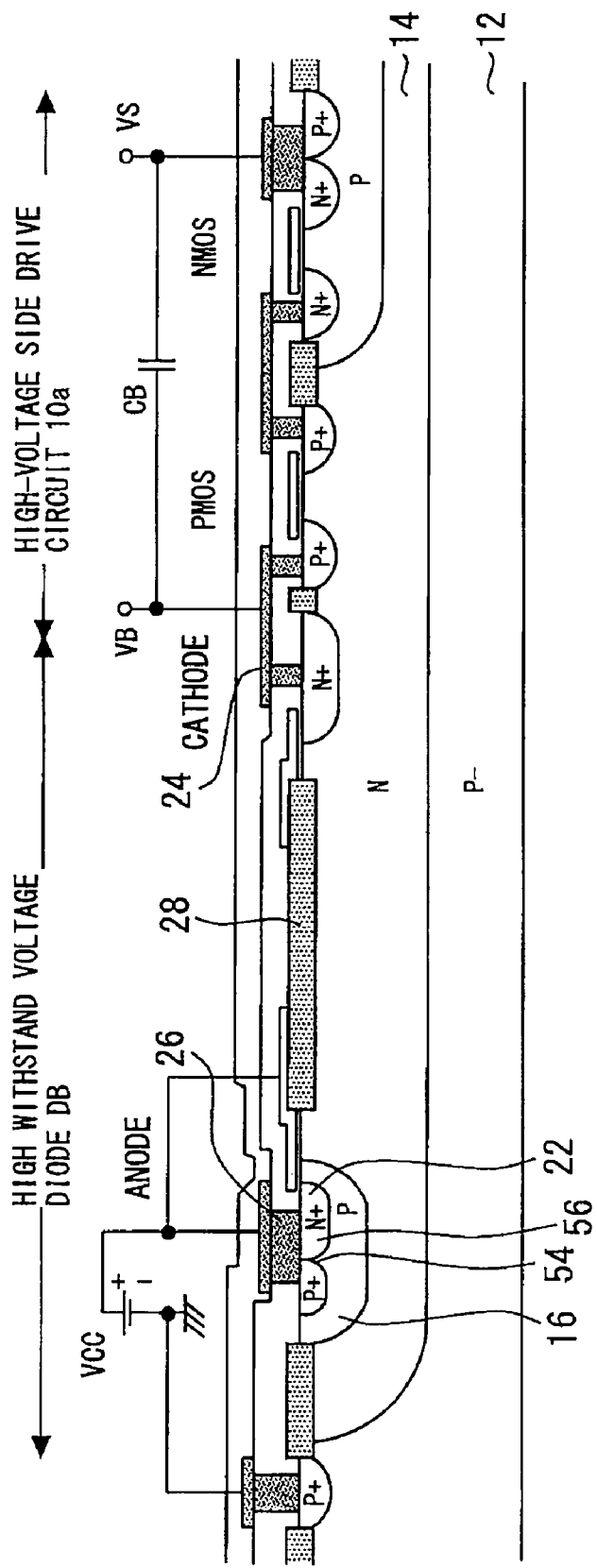
FIG. 27 is a cross-sectional view along A-A' of FIG. 26.
Figure 28:
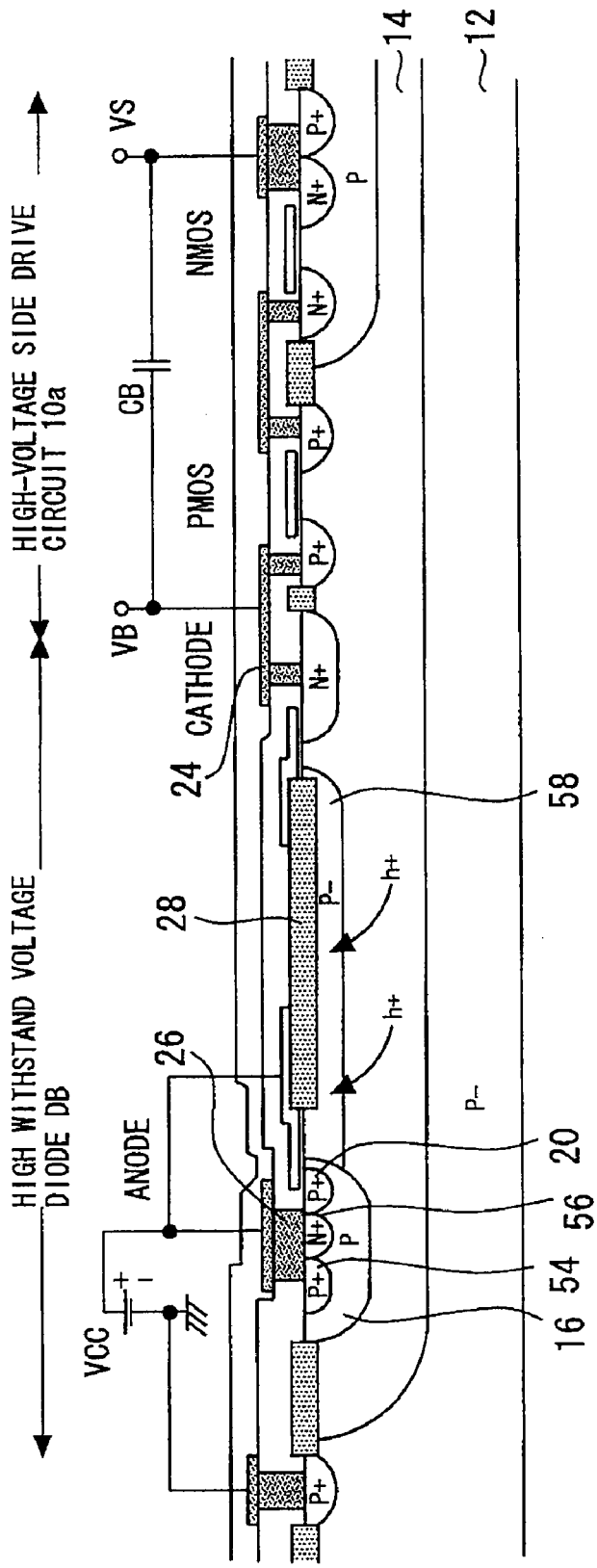
FIG. 28 is a cross-sectional view along B-B' of FIG. 26.

FIG. 26 is a plan view illustrating a high withstand voltage diode according to Ninth embodiment. FIG. 27 is a cross-sectional view along A-A' of FIG. 26. FIG. 28 is a cross-sectional view along B-B' of FIG. 26. In addition to the configuration of Fifth embodiment, the plurality of stripe-shaped P⁻-type voltage holding regions 58 of Seventh embodiment are provided. This allows the effects of Fifth embodiment and Seventh embodiment to be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-145346, filed on Jun. 25, 2010 including specification, claims, drawings and summary, on which the Convention priority of the present application is based, are incorporated herein by reference in its entirety.

What is claimed is:

1. A power semiconductor device comprising:
    a high-voltage side switching element and a low-voltage side switching element which are totem-pole-connected in that order from a high-voltage side between a high-voltage side potential and a low-voltage side potential;
    a high-voltage side drive circuit that drives the high-voltage side switching element;
    a low-voltage side drive circuit that drives the low-voltage side switching element;
    a capacitor which has a first end connected to a connection point between the high-voltage side switching element and the low-voltage side switching element and a second end connected to a power supply terminal of the high-voltage side drive circuit and supplies a drive voltage to the high-voltage side drive circuit; and
    a diode which has an anode connected to a power supply and a cathode connected to the second end of the capacitor and supplies a current from the power supply to the second end of the capacitor,
    wherein the diode includes a P-type semiconductor substrate, an N-type cathode region on a surface of the P-type semiconductor substrate, a P-type anode region in the N-type cathode region, a P-type contact region and an N-type contact region in the P-type anode region, a cathode electrode connected to the N-type cathode region, and an anode electrode connected to the P-type contact region and the N-type contact region.

2. The power semiconductor device according to claim 1, wherein the P-type contact region includes a first P-type region which is closer to the cathode electrode than the N-type contact region.

3. The power semiconductor device according to claim 2, wherein the P-type contact region includes a second P-type region which is provided farther from the cathode electrode than the N-type contact region.

4. The power semiconductor device according to claim 1, wherein the P-type contact region includes a plurality of first P-type regions,
    the N-type contact region includes a plurality of first N-type regions, and
    the plurality of first P-type regions and the plurality of first N-type regions are alternately arranged in a direction perpendicular to a direction from the anode electrode to the cathode electrode on the surface of the P-type semiconductor substrate.

5. The power semiconductor device according to claim 4, wherein the N-type contact region includes a second N-type region which is provided farther from the cathode electrode than the plurality of first P-type regions and the plurality of first N-type regions, and
    the P-type contact region includes a second P-type region which is provided farther from the cathode electrode than the second N-type region.

6. The power semiconductor device according to claim 1, further comprising:
    a field oxide film on the P-type semiconductor substrate between the anode electrode and the cathode electrode; and
    a P-type voltage holding region which is provided in the N-type cathode region, is connected to the P-type anode region, and extends to below the field oxide film.

7. The power semiconductor device according to claim 6, wherein the P-type voltage holding region includes a plurality of stripe-shaped regions, and
    the plurality of stripe-shaped regions are arranged parallel to each other along a direction perpendicular to a direction from the anode electrode to the cathode electrode on the surface of the P-type semiconductor substrate.

* * * * *